United States Patent
Chiang et al.

(10) Patent No.: US 12,479,988 B2
(45) Date of Patent: Nov. 25, 2025

(54) RESIN COMPOSITION AND USES THEREOF

(71) Applicant: TAIWAN UNION TECHNOLOGY CORPORATION, Zhubei (TW)

(72) Inventors: Jen-Chi Chiang, Zhubei (TW); Meng-Huei Chen, Zhubei (TW)

(73) Assignee: TAIWAN UNION TECHNOLOGY CORPORATION, Zhubei (TW)

( * ) Notice: Subject to any disclaimer, the term of this patent is extended or adjusted under 35 U.S.C. 154(b) by 319 days.

(21) Appl. No.: 18/297,783

(22) Filed: Apr. 10, 2023

(65) Prior Publication Data

US 2024/0301189 A1 Sep. 12, 2024

(30) Foreign Application Priority Data

Mar. 2, 2023 (TW) .................. 112107606

(51) Int. Cl.
*C08L 25/02* (2006.01)
*C08J 5/24* (2006.01)
*H05K 1/03* (2006.01)

(52) U.S. Cl.
CPC ............... *C08L 25/02* (2013.01); *C08J 5/244* (2021.05); *H05K 1/0366* (2013.01); *C08J 2325/02* (2013.01); *C08J 2425/10* (2013.01); *C08J 2471/12* (2013.01)

(58) Field of Classification Search
None
See application file for complete search history.

(56) References Cited

U.S. PATENT DOCUMENTS

| | | | |
|---|---|---|---|
| 10,150,856 B2 | 12/2018 | Cai et al. | |
| 2007/0155923 A1* | 7/2007 | Kawabe | C08F 212/36 526/217 |
| 2021/0269595 A1* | 9/2021 | Sato | C08J 5/244 |
| 2021/0355259 A1* | 11/2021 | Liu | B32B 15/20 |

FOREIGN PATENT DOCUMENTS

| | | | |
|---|---|---|---|
| CN | 112679936 A | 4/2021 | |
| TW | 201736413 A | 10/2017 | |
| WO | 2017115813 A1 | 6/2017 | |
| WO | WO-2022134215 A1 * | 6/2022 | ............. B32B 15/14 |
| WO | WO-2023016244 A1 * | 2/2023 | ............. B32B 15/20 |

OTHER PUBLICATIONS

Chen—WO 2022-134215 A1—sis TW D2—IDS—MT—thermosetting w-PPE—2022 (Year: 2022).*
Luo—WO 2023-016244 A1—MT—resin comp w-PPE+vinyl aromatic polymer+compound w-2 double bonds—Feb. 2023 (Year: 2023).*
Office Action received in Taiwan Application No. 112107606, dated Oct. 16, 2023.

* cited by examiner

*Primary Examiner* — John Vincent Lawler
(74) *Attorney, Agent, or Firm* — Greer, Burns & Crain, Ltd

(57) ABSTRACT

A resin composition and uses thereof are provided. The resin composition includes:
 (A) a polyfunctional vinyl aromatic copolymer; and
 (B) a compound having a structure of formula (I),

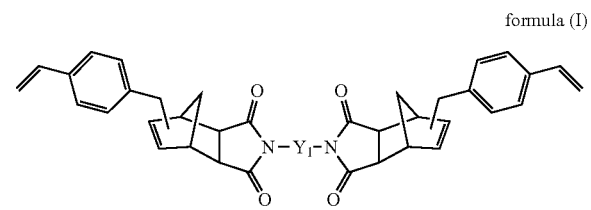

formula (I)

wherein the polyfunctional vinyl aromatic copolymer (A) is prepared by copolymerizing one or more divinyl aromatic compounds with one or more monovinyl aromatic compounds, and in formula (I), $Y_1$ is an organic group.

18 Claims, No Drawings

RESIN COMPOSITION AND USES THEREOF

RELATED APPLICATION

This application claims the benefit of Taiwan Patent Application No. 112107606 filed on Mar. 2, 2023, the subject matters of which are incorporated herein in their entirety by reference.

BACKGROUND

Field of the Invention

The present invention provides a resin composition, especially a resin composition comprising a polyfunctional vinyl aromatic copolymer and a compound with a specific structure. The resin composition of the present invention can be used in combination with a reinforcing material to constitute a prepreg or be used as a metal foil adhesive to prepare a metal-clad laminate and a printed circuit board (PCB).

Descriptions of the Related Art

Due to the increased amount of information communication, information communication in the high-frequency band is actively developed. To pursue outstanding electric properties, especially to reduce the transmission loss in the high-frequency band, the dielectric material used must have a low dielectric constant (Dk) and a low dielectric loss factor (Df), and in particular, the variation of dielectric properties after moisture absorption must be low. In addition, the printed circuit boards and electronic components are exposed to reflow soldering at high temperature during mounting. Therefore, the dielectric material must have a high heat resistance and must have a high glass transition temperature. In particular, due to increased awareness of environmental issues, solder is required to be lead-free and thus has a high melting point. The dielectric material must have sufficient heat resistance. Various curable resins of vinyl-based compounds have been used given the above requirements.

For example, TW 200536862 A discloses a polyfunctional vinyl aromatic copolymer, which can be used to improve the dielectric properties of the dielectric materials. The polyfunctional vinyl aromatic copolymer is obtained by performing a polymerization reaction of 20 mol % to 100 mol % of a divinyl aromatic compound with other optional monomers (such as monomers of ethyl vinyl aromatic compounds) in an organic solvent under the presence of a Lewis acid and an initiator at a reaction temperature of 20° C. to 120° C.

WO 2017-115813 A1 discloses a curable composition comprising a polyfunctional vinyl aromatic copolymer and a free radical initiator. The laminate prepared using the curable composition is acceptable in dielectric properties and is useful in the electric device requiring high functionality and mechanical properties.

However, in the prior art, although the dielectric materials made from the resin composition comprising the polyfunctional vinyl aromatic copolymer have dielectric properties that are acceptable for use in high-frequency applications, they have several deficiencies, including poor adhesion to a metal layer, low glass transition temperature, and high coefficient of thermal expansion.

SUMMARY

Given the aforementioned technical problems, the present invention provides a resin composition that uses a polyfunctional vinyl aromatic copolymer together with a compound with a specific structure. The electronic materials prepared from the cured product of the resin composition can have high glass transition temperature (Tg), low coefficient of thermal expansion (CTE), low dielectric constant (Dk), low dielectric loss factor (Df), excellent aging resistance (low variation of Df), excellent heat resistance after moisture absorption (PCT), excellent processing stability (presented by filling property and tackiness), excellent adhesion to a metal layer (high peeling strength), and low water absorption.

Therefore, an objective of the present invention is to provide a resin composition, which comprises:
(A) a polyfunctional vinyl aromatic copolymer; and
(B) a compound having a structure of formula (I),

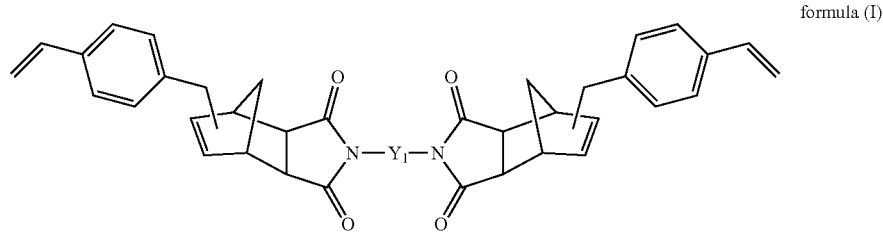

formula (I)

wherein the polyfunctional vinyl aromatic copolymer (A) is prepared by copolymerizing one or more divinyl aromatic compounds with one or more monovinyl aromatic compounds, and in formula (I), $Y_1$ is an organic group.

In some embodiments of the present invention, the polyfunctional vinyl aromatic copolymer (A) comprises a structural unit selected from the group consisting of

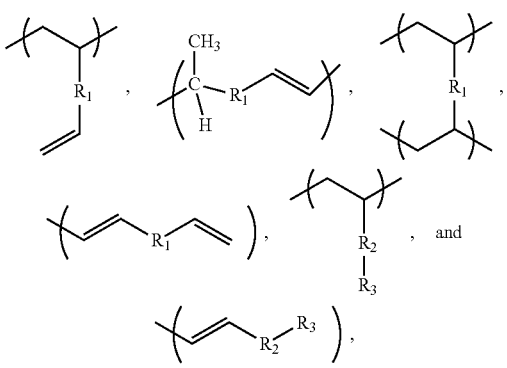

wherein $R_1$ and $R_2$ are independently a $C_6$-$C_{12}$ aromatic hydrocarbyl, and $R_3$ is H or a $C_1$-$C_{12}$ hydrocarbyl.

In some embodiments of the present invention, the the divinyl aromatic compound is selected from the group consisting of divinylbenzene, divinylnaphthalene, divinylbiphenyl, and isomers of the preceding compounds.

In some embodiments of the present invention, the monovinyl aromatic compound is selected from the group consisting of nuclear-alkyl-substituted vinyl aromatic compound, α-alkyl-substituted vinyl aromatic compound, β-alkyl-substituted vinyl aromatic compound, and alkoxyl-substituted vinyl aromatic compound, and combinations thereof.

In some embodiments of the present invention, $Y_1$ in formula (I) is

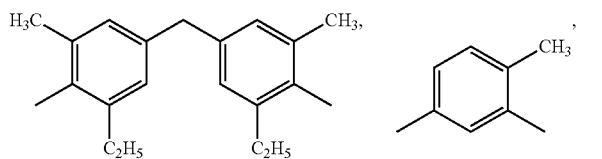

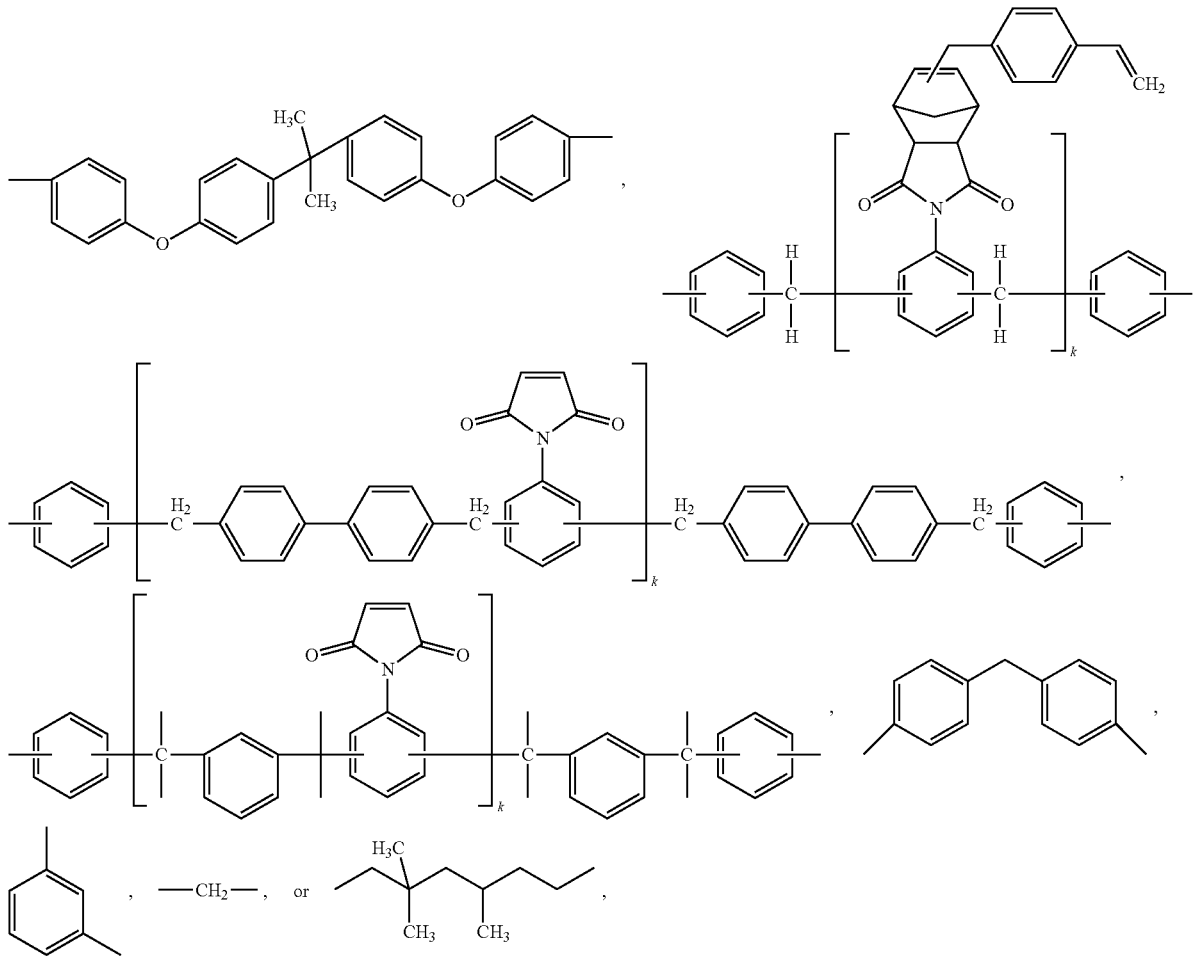

wherein k is an integer of 1 to 5.

In some embodiments of the present invention, the weight ratio of the polyfunctional vinyl aromatic copolymer (A) to the compound (B) having a structure of formula (I) is 5:1 to 1:2.

In some embodiments of the present invention, the resin composition further comprises:

(C) a polyphenylene ether resin represented by the following formula (II):

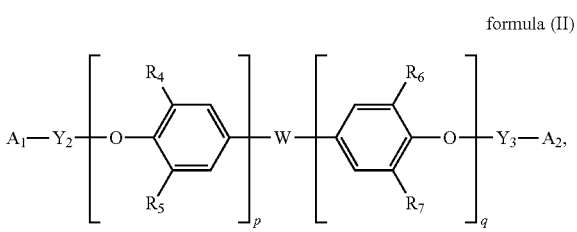

formula (II)

in formula (II),
$R_4$, $R_5$, $R_6$ and $R_7$ are independently H, or a substituted or unsubstituted C1-C5 alkyl;
p and q are independently an integer from 0 to 100, with the proviso that p and q are not both 0;
$Y_2$ and $Y_3$ are independently a direct bond, a carbonyl group, or an alkenyl-containing group;

$A_1$ and $A_2$ are independently

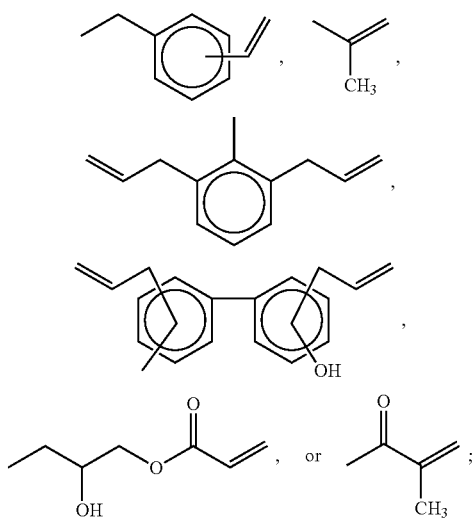

and

W is a direct bond, —O—,

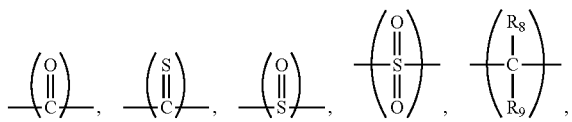

or aryl, wherein $R_8$ and $R_9$ are independently H or a C1-C12 alkyl.

In some embodiments of the present invention, the resin composition further comprises:

(D) a diene compound with a structure of formula (III):

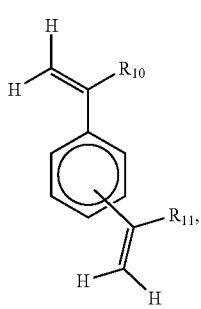

formula (III)

in formula (III), $R_{10}$ and $R_{11}$ are independently H, a C1-C6 linear or branched alkyl, with the proviso that $R_{10}$ and $R_{11}$ are not both H.

In some embodiments of the present invention, the resin composition further comprises:

(E) a compound with a structure of formula (IV):

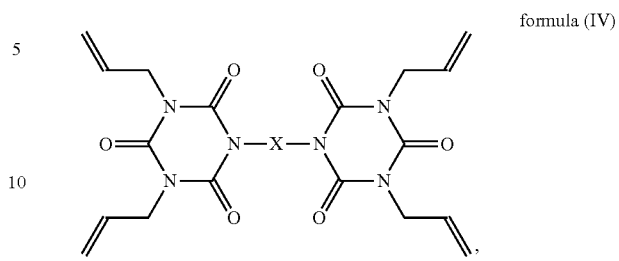

formula (IV)

in formula (IV), X is a C1-C10 linear or branched alkylene.

In some embodiments of the present invention, the resin composition further comprises an additive selected from the group consisting of catalysts, elastomers, fillers, dispersing agents, tougheners, viscosity modifiers, flame retardants, plasticizers, coupling agents, and combinations thereof.

In some embodiments of the present invention, the resin composition further comprises a catalyst selected from the group consisting of dicumyl peroxide, tert-butyl peroxybenzoate, di-tert-amyl peroxide (DTAP), isopropylcumyl-tert-butyl peroxide, tert-butylcumylperoxide, di(isopropylcumyl) peroxide, di-tert-butyl peroxide, α,α'-bis(tert-butylperoxy)diisopropyl benzene, benzoyl peroxide (BPO), 1,1-bis(tert-butylperoxy)-3,3,5-trimethylcyclohexane, 4,4-di(tert-butylperoxy)butyl valerate, 2,5-dimethyl-2,5-di(tert-butylperoxy) hexane, 2,5-dimethyl-2,5-di(tert-butylperoxy)-3-hexyne, and combinations thereof.

In some embodiments of the present invention, the resin composition further comprises an elastomer selected from the group consisting of polybutadiene, styrene-butadiene copolymer, styrene-butadiene-divinylbenzene copolymer, polyisoprene, styrene-isoprene copolymer, acrylonitrile-butadiene copolymer, acrylonitrile-butadiene-styrene copolymer, functional modified derivatives of the preceding compounds, and combinations thereof.

In some embodiments of the present invention, the resin composition further comprises a filler selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene powders, glass beads, ceramic whiskers, carbon nanotubes, nanosized inorganic powders, and combinations thereof.

Another objective of the present invention is to provide a prepreg prepared by impregnating a substrate with the aforementioned resin composition or by coating the aforementioned resin composition onto a substrate and drying the impregnated or coated substrate.

Yet another objective of the present invention is to provide a metal-clad laminate prepared by laminating the aforementioned prepreg and a metal foil or by coating the aforementioned resin composition onto a metal foil and drying the coated metal foil.

A further objective of the present invention is to provide a printed circuit board prepared from the aforementioned metal-clad laminate.

To render the above objectives, technical features, and advantages of the present invention more apparent, the present invention will be described in detail with reference to some embodiments hereinafter.

BRIEF DESCRIPTION OF THE DRAWINGS

Not applicable.

DETAILED DESCRIPTION

Hereinafter, some embodiments of the present invention will be described in detail. However, the present invention may be embodied in various embodiments, and the protection scope of the present invention should not be limited to those described in the specification.

Unless it is additionally explained, the expressions "a," "the," or the like recited in the specification and in the claims should include both the singular and the plural forms.

Unless it is additionally explained, when describing the amount of the components in the solution, mixture, composition, or varnish in the specification, the amount is based on the total weight excluding the solvent.

By using a polyfunctional vinyl aromatic copolymer (A) together with a diene compound having a specific structure in the resin composition, the electronic material prepared from the cured product of the resin composition of the present invention can have outstanding glass transition temperature (Tg), coefficient of thermal expansion (CTE), dielectric constant (Dk), dielectric loss factor (Df), aging resistance (low variation of Df), heat resistance after moisture absorption (PCT), processing stability (presented by filling property and tackiness), adhesion to a metal layer (represented by peeling strength), and water absorption. The resin composition of the present invention and applications thereof are described in detail below.

1. RESIN COMPOSITION

The resin composition of the present invention comprises (A) a polyfunctional vinyl aromatic copolymer and (B) a compound having a structure of formula (I) as the essential components and may further comprise optional components. The detailed descriptions of the components are as follows.

1.1. (A) Polyfunctional Vinyl Aromatic Copolymer

As used herein, the polyfunctional vinyl aromatic copolymer (A) refers to a vinyl aromatic copolymer with at least three reactive vinyl groups. In the resin composition of the present invention, the polyfunctional vinyl aromatic copolymer undergoes crosslinking reaction with the other components having unsaturated functional groups via the reactive vinyl groups to form a stereo network structure. As used herein, the reactive vinyl groups include —CH=CH$_2$ and ethylene (—CH=CH—).

The polyfunctional vinyl aromatic copolymer (A) can be obtained by copolymerization of one or more divinyl aromatic compounds, one or more monovinyl aromatic compounds, and optionally, other monomers. The thus obtained polyfunctional vinyl aromatic copolymer has one or more reactive vinyl groups at the terminals and one or more reactive ethylene groups in the main chain, thereby capable of undergoing crosslinking reactions with other components having unsaturated functional groups.

The divinyl aromatic compound refers to an aromatic compound with two vinyl groups, and examples of the divinyl aromatic compound include but are not limited to divinylbenzene, divinylnaphthalene, divinyl-biphenyl, and isomers thereof. Each divinyl aromatic compounds can be used alone or in any combination. In some embodiments of the present invention, divinylbenzene is used as a divinyl aromatic compound to prepare a polyfunctional vinyl aromatic copolymer, so that the obtained polyfunctional vinyl aromatic copolymer comprises a structural unit derived from divinylbenzene. Examples of the aforementioned divinylbenzene include but not are limited to m-divinylbenzene and p-divinylbenzene.

The monovinyl aromatic compound refers to an aromatic compound with one vinyl group. Examples of the monovinyl aromatic compound include but are not limited to nuclear-alkyl-substituted vinyl aromatic compounds, α-alkyl-substituted vinyl aromatic compounds, β-alkyl-substituted vinyl aromatic compounds, and alkoxy-substituted vinyl aromatic compounds. Each monovinyl aromatic compounds can be used alone or in any combination. In some embodiments of the present invention, the polyfunctional vinyl aromatic copolymer is prepared by using one or more of ethyl vinylbenzene, ethyl vinylnaphthalene and ethyl vinyl-biphenyl, and preferably by using ethyl vinylbenzene. Therefore, the obtained polyfunctional vinyl aromatic copolymer comprises one or more structural units derived from ethyl vinylbenzene, ethyl vinylnaphthalene and ethyl vinyl-biphenyl, and preferably comprises a structural unit derived from ethyl vinylbenzene. Examples of the aforementioned ethyl vinylbenzene include but are not limited to m-ethyl vinylbenzene and p-ethyl vinylbenzene.

Examples of the optionally other monomers useful for preparing the polyfunctional vinyl aromatic copolymer (A) include but are not limited to trivinyl aromatic compounds, trivinyl aliphatic compounds, divinyl aliphatic compounds, and monovinyl aliphatic compounds. The amount of the optionally other monomers is preferably not higher than 50 mol %, more preferably not higher than 30 mol %, based on the total moles of the divinyl aromatic compounds, monovinyl aromatic compounds and the optionally other monomers. In other words, in the polyfunctional vinyl aromatic copolymer, the majority of the polymerization units are those derived from divinyl aromatic compounds and monovinyl aromatic compounds.

In some embodiments of the present invention, the polyfunctional vinyl aromatic copolymer may comprise the following structural units:

$$\text{structures with } R_1, R_2, R_3 \text{ substituents}$$

wherein $R_1$ and $R_2$ are independently a $C_6$-$C_{12}$ aromatic hydrocarbyl, and $R_3$ is H or a $C_1$-$C_{12}$ hydrocarbyl.

The Mw of the polyfunctional vinyl aromatic copolymer (A) can be 500 to 10,000, preferably 1000 to 5000. If the Mw of the polyfunctional vinyl aromatic copolymer is too high, such as higher than 10,000, the fluidity of the resin composition may degrade, which makes it difficult for subsequent processing. If the Mw of the polyfunctional vinyl aromatic copolymer is too low, such as lower than 500, the heat resistance of the prepared electronic material may degrade.

An example of the method for preparing the polyfunctional vinyl aromatic copolymer (A) may be described as follows: a method comprising copolymerizing the divinyl aromatic compound, the monovinyl aromatic compounds, and the optionally other monomers in the presence of a Lewis base compound and catalyst, wherein the catalyst is at least one member selected from the group consisting of inorganic acids, organic sulfonic acids, and perchlorates. The Lewis base compound acts as a promoter. During the polymerization reaction, the Lewis base compound can control the interaction between the catalyst and the hydrogen at β position of carbonium to regulate the relative reaction rate between the β-dehydrogenation reaction and the 1,2-addition reaction of vinyl groups. For more details of the preparation method of the polyfunctional vinyl aromatic copolymer (A), reference can be made to TW 201736413 A, which is incorporated herein in its entirety by reference.

Based on the total weight of the resin composition, the amount of the polyfunctional vinyl aromatic copolymer (A) can be 15 wt % to 40 wt %. For example, based on the total weight of the resin composition, the amount of the polyfunctional vinyl aromatic copolymer (A) can be 15 wt %, 16 wt %, 17 wt %, 18 wt %, 19 wt %, 20 wt %, 21 wt %, 22 wt %, 23 wt %, 24 wt % 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, or 40 wt %, or within a range between any two of the values described herein, but the present invention is not limited thereto.

1.2. (B) Compound Having a Structure of Formula (I)

In the present invention, the resin composition comprises a compound (B) having a structure of formula (I). The compound having a structure of formula (I) has unsaturated functional groups, so that it can be subjected to cross-linking reaction with the polyfunctional vinyl aromatic copolymer (A) to form a stereo network structure.

formula (I)

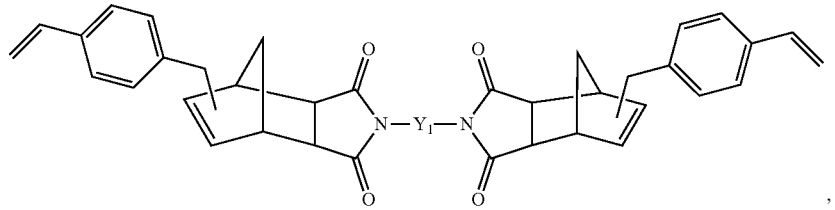

wherein $Y_1$ is an organic group, and examples of the organic group include but are not limited to 3,3'-dimethyl-5,5'-diethyl-4,4'-diphenylmethyl (i.e.,

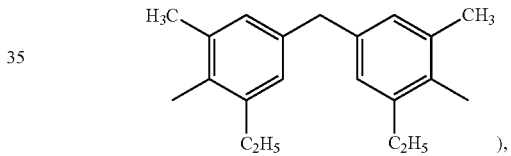

), 4-methyl-1,3-phenylene (i.e.,

), bisphenol A diphenyl ether group (i.e.,

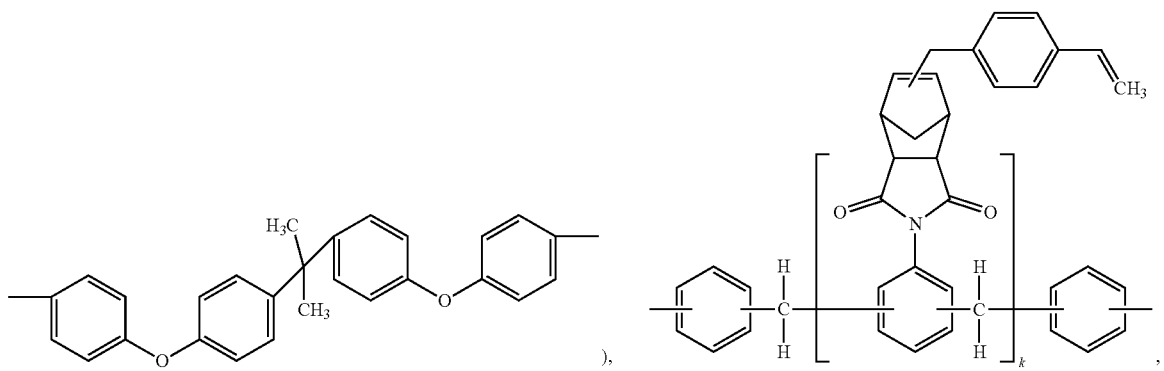

),

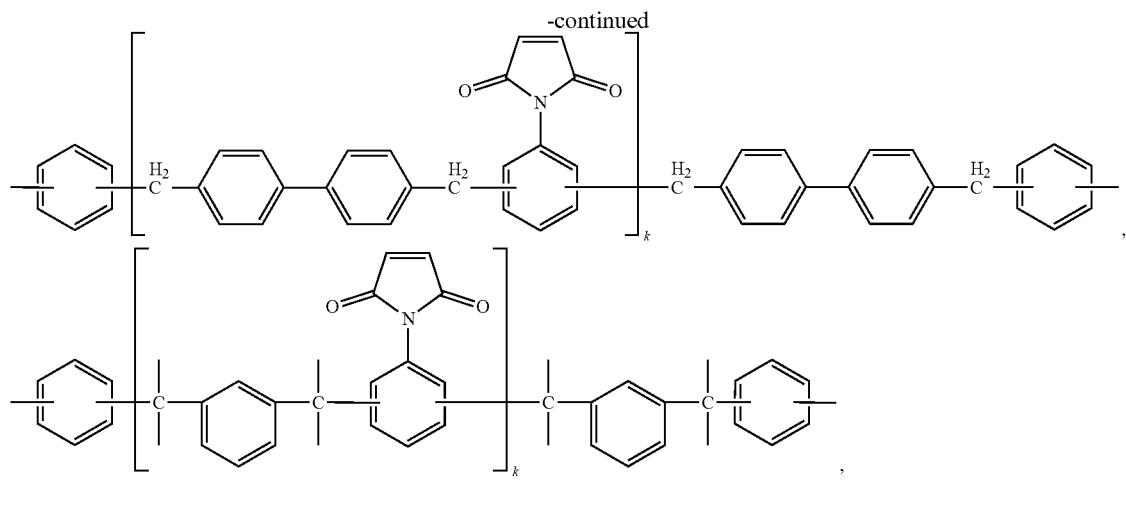

4,4'-diphenylmethyl (i.e.,

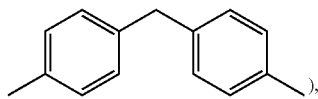), m-phenylene (i.e.,

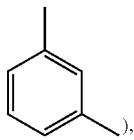), methylene (i.e. —CH₂—), or (2,2,4-trimethyl)hexylene (i.e.,

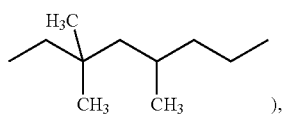), wherein k is an integer of 1 to 5.

The compound (B) having a structure of formula (I) has cross-linkable unsaturated functional groups (i.e. double bonds). Therefore, the compound can facilitate a cross-linking reaction to achieve the goal of thermoset through conventional thermal or a peroxide catalyst mechanism. The compound can also react with any conventional cross-linking agent having unsaturated group(s), such as a vinyl-containing compound, an allyl-containing compound, and a modified PPE (such as an allyl-containing PPE).

The compound (B) having a structure of formula (I) is a bismaleimide (BMI) derivative which is terminally vinyl modified. The derivative can be prepared by functionalizing a bismaleimide (BMI) compound. The bismaleimide compound is a compound having a structure of

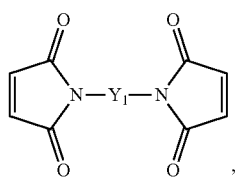

wherein $Y_1$ has the definition as described above. For example, the compound having the structure of formula (I) can be prepared by the following method. First, as shown in the following chemical equation, a "vinylbenzyl (VB) (such as vinylbenzyl chloride)" is reacted with "cyclopentadiene (CPD)" to obtain 4-vinylbenzyl substituted cyclopentadiene (VB-CPD).

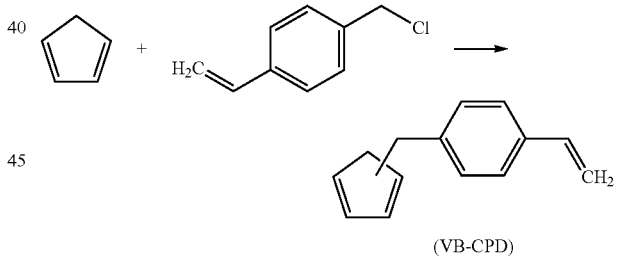

Then, VB-CPD is reacted with a bismaleimide compound to obtain a terminally vinyl-modified bismaleimide derivative having the structure of formula (I). Regarding specific examples of the preparation of the compound having the structure of formula (I), reference may be made to the Synthesis Examples provided in the Example section.

In the resin composition of the present invention, based on the total weight of the resin composition, the amount of the compound (B) having a structure of formula (I) can be 5 wt % to 40 wt %. For example, based on the total weight of the resin composition, the amount of the compound (B) having a structure of formula (I) can be 5 wt %, 6 wt %, 7 wt %, 8 wt % 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt % 30 wt %, 31 wt %, 32 wt %, 33 wt %, 34 wt % 35 wt % 36 wt %, 37 wt % 38 wt %, 39 wt % or 40 wt %, or within a range between any two of the values described herein. If the amount of the compound (B) having a structure of formula (I) is not within the aforementioned range, the obtained electronic material may not have good dielectric properties and water absorption rate.

In a preferred embodiment of the present invention, the weight ratio of the aforementioned polyfunctional vinyl aromatic copolymer (A) to the compound (B) having a structure of formula (I) is 5:1 to 1:2. For example, the weight ratio of the aforementioned polyfunctional vinyl aromatic copolymer (A) to the compound (B) having a structure of formula (I) can be 5:1, 4.5:1, 4:1, 3.5:1, 3:1, 2.5:1, 2:1, 1.5:1, 1:1, 1:1.5, or 1:2, or within a range between any two of the values described herein.

1.3. Optional Components

Without departing from the technical principle of the present invention, the resin composition of the present invention may further comprise optional components, such as other components having unsaturated functional groups, or additives. Examples of the aforementioned other components include but are not limited to a polyphenylene ether resin (C) represented by formula (II), a diene compound (D) with a structure of formula (III), and a compound (E) with a structure of formula (IV), which will be described below.

1.3.1. (C) Polyphenylene Ether Resin Represented by Formula (II)

In some embodiments of the present invention, the resin composition may further comprise a polyphenylene ether resin (C) represented by formula (II):

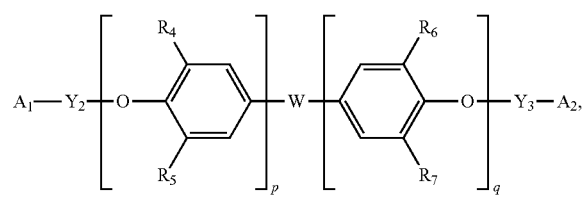

formula (II)

in formula (II), $R_4$, $R_5$, $R_6$ and $R_7$ are independently H, or a substituted or unsubstituted C1-C5 alkyl, and preferably are independently —$CH_3$; p and q are independently an integer from 0 to 100, with the proviso that p and q are not both 0; $Y_2$ and $Y_3$ are independently a direct bond, a carbonyl group, or an alkenyl-containing group, and preferably are independently a direct bond; $A_1$ and $A_2$ are independently

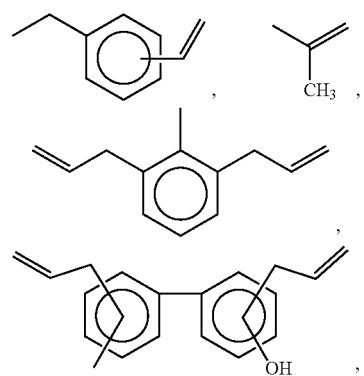

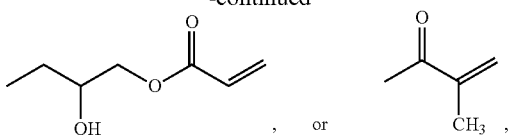

and preferably are independently

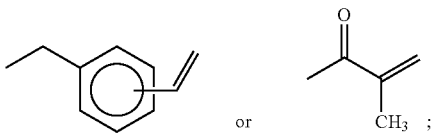

and W is a direct bond, —O—,

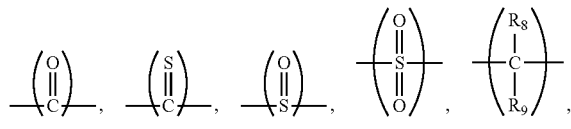

or aryl, wherein $R_8$ and $R_9$ are independently H or a C1-C12 alkyl.

In some embodiments of the present invention, the resin composition may comprise at least two polyphenylene ether resin represented by formula (II), wherein $A_1$ and $A_2$ are independently

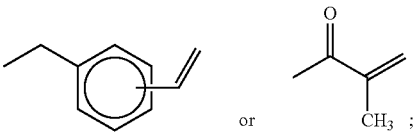

W is aryl or

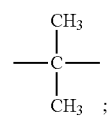

$Y_2$ and $Y_3$ are independently direct bonds; $R_4$, $R_5$, $R_6$ and $R_7$ are methyl, and 20≤(p+q)≤25.

Examples of commercially available polyphenylene ether resin represented by formula (II) include OPE-2st and OPE-2EA available from MITSUBISHI GAS CHEMICAL Company, SA-9000 available from SABIC Company, PP807 available from Chin Yee Chemical Industry Company, and a polyphenylene ether resin available from ASAHI KASEI Company.

In the resin composition of the present invention, based on the total weight of the resin composition, the amount of the polyphenylene ether resin (C) represented by formula (II) can be 1 wt % to 20 wt %. For example, based on the total weight of the resin composition, the amount of the polyphenylene ether resin (C) represented by formula (II) can be 1 wt %, 2 wt % 3 wt %, 4 wt %, 5 wt %, 6 wt %, 7 wt % 8 wt %, 9 wt % 10 wt %, 11 wt % 12 wt %, 13 wt %, 14 wt %, 15 wt %, 16 wt %, 17 wt %, 18 wt %, 19 wt %, or 20 wt %, or within a range between any two of the values described herein, but the present invention is not limited thereto.

1.3.2. (D)Diene Compound with a Structure of Formula (III)

In some embodiments of the present invention, the resin composition may further comprise a diene compound (D) with a structure of the following formula (III) to further improve the peeling strength and water absorption properties of the electronic material prepared from the resin composition. The diene compound is an aromatic compound with two vinyl functional groups in a molecule, and can react with other components having an unsaturated functional group through the vinyl functional groups.

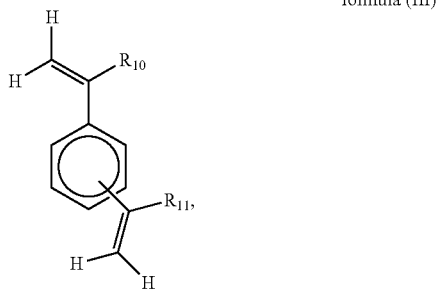

formula (III)

in formula (III), $R_{10}$ and $R_{11}$ are independently H, a C1-C6 linear or branched alkyl, with the proviso that $R_{10}$ and $R_{11}$ are not both H. $R_{10}$ and $R_{11}$ are preferably independently a $C_1$-$C_6$ linear or branched alkyl. Examples of linear alkyl include but are not limited to methyl, ethyl, propyl, butyl, and pentyl. Examples of branched alkyl include but are not limited to isopropyl, isobutyl, and isopentyl. In a preferred embodiment of the present invention, $R_{10}$ and $R_{11}$ are independently methyl, ethyl, or propyl, particularly methyl or ethyl, and more particularly methyl. The electronic material prepared from the resin composition of the preferred embodiment above can have better peeling strength and water absorption.

Examples of the diene compound (D) with a structure of formula (III) include but are not limited to 1-isopropenyl-2-vinylbenzene, 1-isopropenyl-3-vinylbenzene, 1-isopropenyl-4-vinylbenzene, 1,2-diisopropenylbenzene, 1,3-diisopropenylbenzene, and 1,4-diisopropenylbenzene. Each of the aforementioned diene compounds can be used alone or in any combination. An example of a commercially available diene compound (D) with a structure of formula (III) includes the product of model number IP-AMS available from Deltech Corporation.

In the resin composition of the present invention, based on the total weight of the resin composition, the amount of the diene compound (D) with a structure of formula (III) can be 1 wt % to 10 wt %. For example, based on the total weight of the resin composition, the amount of the diene compound (D) with a structure of formula (III) can be 1 wt %, 2 wt %, 3 wt %, 4 wt %, 5 wt %, 6 wt %, 7 wt %, 8 wt %, 9 wt %, or 10 wt %, or within a range between any two of the values described herein, but the present invention is not limited thereto.

1.3.3. (E) Compound with a Structure of Formula (IV)

In some embodiments of the present invention, the resin composition may further comprise a compound (E) with a structure of the following formula (IV):

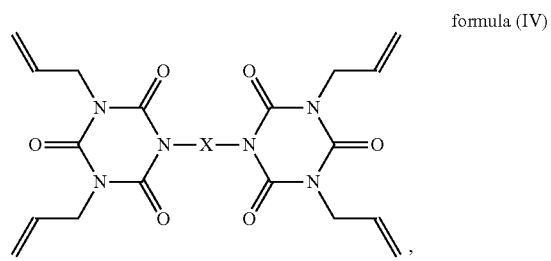

formula (IV)

in formula (IV), X is a C1-C10 linear or branched alkylene or alkylene chain. As used herein, an "alkylene" or "alkylene chain" refers to a straight or branched divalent hydrocarbyl (alkyl) chain linking other parts of a molecule to another group and is consisting of carbon and hydrogen. Examples of the C1-C10 linear or branched alkylene include but are not limited to methylene, ethylene, n-propylene, isopropylene, n-butylene, isobutylene, sec-butylene, tert-butylene, n-pentylene, isopentylene, neopentylene, n-hexylene, isohexylene, n-heptylene, isoheptylene, n-octylene, isooctylene, n-nonylene, isononylene, n-decylene, and isodecylene.

Examples of the compound (E) with a structure of formula (IV) include but are not limited to 1,1'-(1,1-methyl)bis(3,5-diallyl-1,3,5-triazine-2,4,6-trione), 1,1'-(1,2-ethyl)bis(3,5-diallyl-1,3,5-triazine-2,4,6-trione), 1,1'-(1,3-propyl)bis(3,5-diallyl-1,3,5-triazine-2,4,6-trione), 1,1'-(1,4-butyl)bis(3,5-diallyl-1,3,5-triazine-2,4,6-trione), 1,1'-(1,5-pentyl)bis(3,5-diallyl-1,3,5-triazine-2,4,6-trione), 1,1'-(1,6-hexyl)bis(3,5-diallyl-1,3,5-triazine-2,4,6-trione), 1,1'-(1,7-heptyl)bis(3,5-diallyl-1,3,5-triazine-2,4,6-trione), 1,1'-(1,8-octyl)bis(3,5-diallyl-1,3,5-triazine-2,4,6-trione), 1,1'-(1,9-nonyl)bis(3,5-diallyl-1,3,5-triazine-2,4,6-trione), and 1,1'-(1,10-decyl)bis(3,5-diallyl-1,3,5-triazine-2,4,6-trione). Each of the aforementioned compounds can be used alone or in any combination.

The compound (E) with a structure of formula (IV) can be obtained by reacting diallyl isocyanurate with a hydrocarbyl halide in the presence of a catalyst. Examples of the hydrocarbyl halide include but are not limited to hydrocarbyl bromides, such as 2-bromomethane, 2-bromoethane, 2-bromopropane, 2-bromobutane, 2-bromopentane, 2-bromohexane, 2-bromoheptane, 2-bromooctane, 2-bromononane, and 2-bromodecane. Examples of the catalyst include but are not limited to potassium carbonate, potassium hydroxide, sodium carbonate, and sodium hydroxide. Detailed preparation of the compound will be illustrated in the appended Examples.

In some embodiments of the present invention, based on the total weight of the resin composition, the amount of the compound (E) with a structure of formula (IV) can be 1 wt % to 15 wt %. For example, based on the total weight of the resin composition, the amount of the compound (E) with a structure of formula (IV) can be 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, or 15 wt %, or within a range between any two of the values described herein, but the present invention is not limited thereto.

1.3.4. Additives

The resin composition of the present invention may further comprise additives, such as catalysts, elastomers, fillers exemplified below and various additives known in the art, to adaptively improve the processability of the resin composition during the production process or to improve the physicochemical properties of the dielectric materials prepared from the resin composition. Examples of the additives known in the art include but are not limited to dispersing agents, tougheners, viscosity modifiers, flame retardants, plasticizers, and coupling agents. Use of the additives is not a key feature of the present invention and can be carried out by persons having ordinary skill in the art based on the disclosure of the present invention as well as their ordinary skill.

1.3.4.1. Catalyst

In some embodiments of the present invention, the resin composition may further comprise a catalyst. The catalyst can be any component known in the art that can promote a cross-linking reaction. Examples of the catalyst include but are not limited to organic peroxides. Examples of the organic peroxides include but are not limited to dicumyl peroxide, tert-butyl peroxybenzoate, di-tert-amyl peroxide (DTAP), isopropylcumyl-tert-butyl peroxide, tert-butylcumylperoxide, di(isopropylcumyl) peroxide, di-tert-butyl peroxide, α,α'-bis(tert-butylperoxy)diisopropyl benzene, benzoyl peroxide (BPO), 1,1-bis(tert-butylperoxy)-3,3,5-trimethylcyclohexane, 4,4-di(tert-butylperoxy)butyl valerate, 2,5-dimethyl-2,5-di(tert-butylperoxy) hexane, and 2,5-dimethyl-2,5-di(tert-butylperoxy)-3-hexyne. The aforementioned organic peroxides can be used alone or in any combination.

In general, based on the total weight of the resin composition, the amount of the catalyst can be 0.1 wt % to 1 wt %. For example, based on the total weight of the resin composition, the amount of the catalyst can be 0.1 wt %, 0.2 wt %, 0.3 wt %, 0.4 wt %, 0.5 wt %, 0.6 wt %, 0.7 wt %, 0.8 wt %, 0.9 wt %, or 1 wt %, or within a range between any two of the values described herein, but the present invention is not limited thereto.

1.3.4.2. Elastomer

In some embodiments of the present invention, the resin composition may further comprise an elastomer. An elastomer can improve the toughness of the prepared electronic materials. Examples of the elastomer include but are not limited to polybutadiene, styrene-butadiene copolymer, styrene-butadiene-divinylbenzene copolymer, polyisoprene, styrene-isoprene copolymer, acrylonitrile-butadiene copolymer, acrylonitrile-butadiene-styrene copolymer, and functional modified derivatives of the preceding compounds. The aforementioned elastomers can be used alone or in any combination. Examples of the aforementioned functional modified derivatives include but are not limited to maleic anhydride-modified polybutadiene and maleic anhydride-modified polybutadiene-styrene copolymer. In the appended Examples, styrene-butadiene copolymer and styrene-butadiene-divinylbenzene copolymer are used.

In general, based on the total weight of the resin composition, the amount of the elastomer can be 1 wt % to 10 wt %. For example, based on the total weight of the resin composition, the amount of the elastomer can be 1 wt %, 2 wt %, 3 wt %, 4 wt %, 5 wt %, 6 wt %, 7 wt %, 8 wt %, 9 wt %, or 10 wt %, or within a range between any two of the values described herein, but the present invention is not limited thereto.

1.3.4.3. Filler

In some embodiments of the present invention, the resin composition may further comprise a filler. Examples of the filler include but are not limited to silica (including hollow silica), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene powders, glass beads, ceramic whiskers, carbon nanotubes, and nanosized inorganic powders. The mentioned fillers can be used alone or in any combination.

In general, based on the total weight of the resin composition, the amount of the filler can be 30 wt % to 45 wt %. For example, based on the total weight of the resin composition, the amount of the filler can be 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, or 45 wt %, or within a range between any two of the values described herein, but the present invention is not limited thereto.

1.4. Preparation of Resin Composition

The resin composition of the present invention may be prepared into a varnish for subsequent processing by uniformly mixing the components of the resin composition, including the polyfunctional vinyl aromatic copolymer (A), the compound (B) having a structure of formula (I), and optional components (such as the polyphenylene ether resin (C) represented by formula (II), the diene compound (D) with a structure of formula (III), the compound (E) with a structure of formula (IV), and additives), with a stirrer, and dissolving or dispersing the resultant mixture in a solvent. The solvent can be any inert solvent that can dissolve or disperse the components of the resin composition but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). Each of the mentioned solvents can be used alone or in any combination. The content of the solvent in the resin composition is not limited as long as the components of the resin composition can be well dissolved or dispersed therein. In some embodiments of the present invention, the solvent is a mixture of methyl ethyl ketone (MEK) and toluene.

2. PREPREG

The present invention also provides a prepreg prepared from the aforementioned resin composition, wherein the prepreg is prepared by impregnating a substrate with the aforementioned resin composition or by coating the aforementioned resin composition onto a substrate and drying the impregnated or coated substrate. Examples of the substrate include but are not limited to papers, cloths, or mats made from a material selected from the group consisting of paper fibers, glass fibers, quartz fibers, organic polymer fibers, carbon fibers, and combinations thereof. Examples of the organic polymer fibers include but are not limited to high-modulus polypropylene (HMPP) fibers, polyamide fibers, ultra-high molecular weight polyethylene (UHMWPE), and liquid crystal polymer. The cloths made from the material selected from the aforementioned group can be woven or non-woven. In some embodiments of the present invention, 1078 reinforced glass fabric is used as a reinforcing material, and the resin composition is heated and dried at 175° C. for 2 to 15 minutes (B-stage) to prepare a semi-cured prepreg.

3. METAL-CLAD LAMINATE AND PRINTED CIRCUIT BOARD

The present invention also provides a metal-clad laminate, which is obtained by laminating the aforementioned prepreg with a metal foil. Specifically, the metal-clad laminate of the present invention comprises a dielectric layer and a metal layer. The metal-clad laminate can be prepared by superimposing a plurality of the aforementioned prepregs as the dielectric layer, superimposing a metal foil (such as a copper foil, as the metal layer) on at least one external surface of the dielectric layer composed of the superimposed prepregs to provide a superimposed object, and then performing a hot-pressing operation to the superimposed object to obtain the metal-clad laminate. Alternatively, the metal-clad laminate can be prepared by coating the aforementioned resin composition directly on a metal foil and drying the coated metal foil.

The external metal foil of the metal-clad laminate can be further subjected to patterning to provide a printed circuit board.

4. EXAMPLES 4.1. Testing Methods

The present invention is further illustrated by the embodiments hereinafter, wherein the testing instruments and methods are as follows.

[Glass Transition Temperature (Tg) Test]

The copper-clad laminate is etched to remove the copper foils at both sides to obtain an unclad laminate. The unclad laminate is subjected to a glass transition temperature (Tg) test. Specifically, the Tg of the unclad laminate is determined using a dynamic mechanical analyzer of model number "Q800", available from TA Instruments. The testing conditions are as follows: the mode is bending mode, the frequency is 10 Hz, the heating rate is 5° C./min, and the dynamic viscoelasticity is measured during the course of heating from room temperature to 280° C. The Tg is the temperature at which tan δ in the resulting viscoelasticity curve is at maximum.

[Coefficient of Thermal Expansion (z-CTE) Test]

A thermomechanical analyzer (TMA) is used to measure the coefficient of thermal expansion of the fully cured resin composition in Z-direction (in the thickness direction of the substrate) (Z-CTE). The testing method is as follows: preparing a sample of fully cured resin composition sized at 5 mm×5 mm×1.5 mm; setting the conditions as follows: a starting temperature of 30° C., an end temperature of 330° C., a heating rate of 10° C./min, and a load of 0.05 Newton (N); and subjecting the sample to a thermomechanical analysis under the aforementioned conditions in expansion/compression mode to measure the values of thermal expansion per 1° C. in the range of 30° C. to 330° C. and then averaging the measured values. The unit of the z-CTE is %.

[Dielectric Properties Test (the Dielectric Constant ($Dk_0$) and the Dielectric Loss Factor ($Df_0$) in Dried State)]

The copper-clad laminate is etched to remove the copper foils at both sides to obtain an unclad laminate as a test specimen. The test specimen is placed into a dryer at 105° C. and dried for 2 hours to remove the moisture in the test specimen. Then, the test specimen is taken out from the dryer and placed into a desiccator, and the temperature is set back to 25° C. The dielectric constant and the dielectric loss factor of the test specimen is determined by a cavity perturbation method. Specifically, a network analyzer (ZNA67 from Rohde & Schwarz Company) is used to determine the dielectric constant ($Dk_0$) and the dielectric loss factor ($Df_0$) of the test specimen at 10 GHz in dried state.

[Thermal-Oxidative Aging Resistance Test (Variation of Dielectric Loss Factor ($\Delta Df_1$) after High-Temperature Treatment)]

The copper-clad laminate is etched to remove the copper foils at both sides to obtain an unclad laminate as a test specimen. The test specimen is placed into a dryer at 105° C. and dried for 2 hours to remove the moisture in the test specimen. Then, the test specimen is taken out from the dryer and placed into a desiccator, and the temperature is set back to 25° C. The dried test specimen is placed in an oven at 125° C. for 30 days, and the same testing procedures described in the above dielectric properties test section is repeated to determine the dielectric loss factor ($Df_1$) of the test specimen at 10 GHz after the high-temperature treatment. The variation of dielectric loss factor $\Delta Df_1$ is calculated according to the formula below and is evaluated according to the standard below. The smaller the variation, the better the thermal-oxidative aging resistance of the test specimen.

$$\Delta Df_1 = Df_1 - Df_0$$

⊚: the variation is 0.0025 or lower.
○: the variation is higher than 0.0025 and not higher than 0.0030.
Δ: the variation is higher than 0.0030 and not higher than 0.0045.
x: the variation is higher than 0.0045.

[Damp-Heat Aging Resistance Test (Variation of Dielectric Loss Factor ($\Delta Df_2$) after High-Temperature and High-Moisture Treatment)]

The copper-clad laminate is etched to remove the copper foils at both sides to obtain an unclad laminate as a test specimen. The test specimen is placed into a dryer at 105° C. and dried for 2 hours to remove the moisture in the test specimen. Then, the test specimen is taken out from the dryer and placed into a desiccator, and the temperature is set back to 25° C. The dried test specimen is placed under an environment at 85° C. with a relative humidity (RH) of 85% for 30 days, and the same testing procedures described in the above dielectric properties test section is repeated to determine the dielectric loss factor ($Df_2$) of the test specimen at 10 GHz after the high-temperature and high-moisture treatment. The variation of dielectric loss factor $\Delta Df_2$ is calculated according to the formula below and is evaluated according to the standard below. The smaller the variation, the better the thermal-oxidative aging resistance of the test specimen.

$$\Delta Df_2 = Df_2 - Df_0$$

⊚: the variation is 0.0025 or lower.
○: the variation is higher than 0.0025 and not higher than 0.0030.
Δ: the variation is higher than 0.0030 and not higher than 0.0045.
X: the variation is higher than 0.0045.

[Heat Resistance after Moisture Absorption Test (PCT Heat Resistance Test)]

The heat resistance after moisture absorption is performed according to the method of JIS C5012 and is used to evaluate the thermal resistance of solder-floating after laying the laminate under an environment of a temperature of 60° C.

and a relative humidity (RH) of 60% for 120 hours. The metal-clad laminate is subjected to solder-floating in a solder bath at a temperature of 288° C. for 60 seconds and then is inspected visually and by an optical microscope (a magnification of 5× to 1000× can be used) to see if there are deficiencies, such as measling or swelling. If no defects such as measling or swelling are found, the PCT thermal resistance test result is recorded as "○", meaning that the laminate passes the PCT thermal resistance test. If any defects such as measling or swelling are found, the PCT thermal resistance test result is recorded as "×", meaning that the laminate fails in the PCT thermal resistance test.

[Filling Test]

A glass-fiber epoxy substrate with plated through holes formed by panel plating is prepared. The thickness of the substrate is 1.8 mm, and the diameter of each plating through hole is 0.9 mm. A 1078 NE-glass fiber fabric is impregnated or coated with the resin composition and dried at 175° C. for 2 to 5 minutes (B-stage) to obtain a semi-cured prepreg (having a resin content of 70% and a thickness of 0.88 mm). After that, two prepregs are placed on one side of the glass-fiber epoxy substrate having through holes and then heated to 200° C. to 220° C. at a heating rate of 2° C./min to 4° C./min, and hot-pressed and cured at the said temperature under full pressure of 18 kg/cm$^2$ (an initial pressure of 8 kg/cm$^2$) for 120 minutes to provide a sample for evaluation. The sample is placed under an optical microscope at a magnification of 100× to observe cross-sections of 588 filled plated through holes. The results are evaluated according to the following references. When all the plated through holes are completely filled, or only a few through holes (118 or less) are not completely filled, the filling property of the resin composition is suitable, and the result is recorded as "O". When the resin composition leaks from the bottom of the through holes or many of the through holes (more than 118) are not completely filled, the filling property of the resin composition is poor, and the result is recorded as "×"

[Tackiness Test]

The impregnated or coated inorganic fiber woven fabric is dried under 175° C. for 2 to 5 minutes (B-stage) to obtain a semi-cured prepreg. After that, the stacking of the prepreg is observed by unaided eyes. If no spalling of powders or tacky phenomena is not found, the result is recorded as "○", meaning that the prepreg is not tacky and the processability thereof is good; and if spalling or tacky phenomena is found, the result is recorded as "×", meaning that the prepreg is tacky and the processability thereof is poor.

[Peeling Strength Test]

The peeling strength refers to the adhesion of the metal foil to the dielectric layer. The peeling strength is expressed by the force required for vertically peeling a ⅛-inch-wide copper foil from the laminate. The unit of the peel strength is lbf/in.

[Water Absorption Rate Test]

The water absorption rate test is conducted according to IPC-TM650 2.6.2.1. The prepreg is cut into a sample of 2 inch×2 inch and is dried and weighted (precisely weighted to 0.1 mg). After that, the sample is soaked in a distilled water bath at a constant temperature of 23±1.1° C. for 24 hours, and after water absorption, the sample is weighted again (precisely weighted to 0.1 mg). The ratio in the percentage of the difference between the weight of the sample after water absorption and the dry weight of the sample relative to the dry weight of the sample is the water absorption rate.

4.2. Preparation of Compound 4.2.1. Preparation of Compound with a Structure of Formula (I)

[Preparation of Terminal Modifier VB-CPD]

17.5 g of sodium hydride was washed with hexane to remove mineral oil. Then, the washed sodium hydride was suspended in 350 mL hexane in a 1000 mL round-bottom flask. The flask was filled with an inert atmosphere and cooled to 5° C.

44.0 g of fresh-cracked cyclopentadiene (CPD) was added portionwise into the flask with vigorous stirring. After the addition of CPD was done, the temperature was raised to 60° C. with a reflux system. Afterward, 100 g of 4-vinylbenzyl chloride (VB) was added portionwise into the flask.

150 g of deionized water was added with vigorous stirring for 30 minutes to obtain a biphasic mixture. Then, the organic phase of the biphasic mixture was washed with 10 wt % of aqueous HCl solution and deionized water several times.

The organic phase was separated and dried with sodium sulfate, and then subjected to rotary distillation to remove solvent to obtain 4-vinylbenzyl substituted cyclopentadiene (VB-CPD) represented by the following formula.

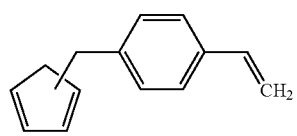

(VB-CPD)

Synthesis Example 1: Synthesis of S1B Compound 7.80 g of VB-CPD and 10.0 g of 3,3'-dimethyl-5,5'-diethyl-4,4'-diphenylmethanebismaleimide (i.e., a compound represented by formula S1A below) were mixed and dissolved in 20.0 g of dichloromethane solvent. The resulting homogenous solution was allowed to react at room temperature for 30 minutes, and then the dichloromethane solvent was removed by rotary evaporation at 50° C., yielding a compound having a structure of formula (I) represented by formula S1B below.

formula S1A

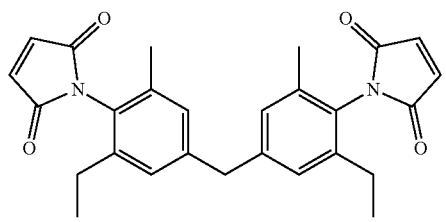

formula S1B

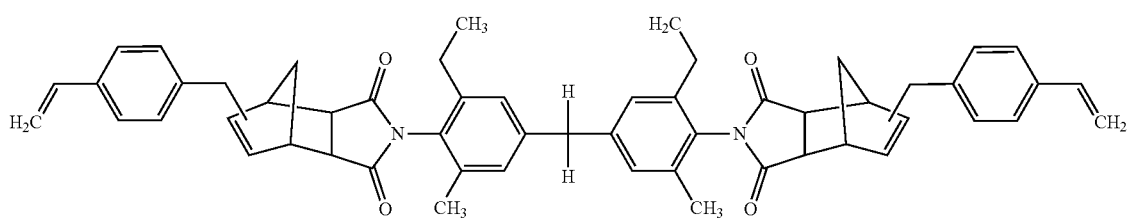

Synthesis Example 2: Synthesis of S2B Compound 10.0 g of VB-CPD and 10.0 g of a compound represented by formula S2A below were mixed and dissolved in 20.0 g of dichloromethane solvent. The resulting homogenous solution was allowed to react at room temperature for 30 minutes, and then the dichloromethane solvent was removed by rotary evaporation at 50° C., yielding a compound having a structure of formula (I) represented by formula S2B below. In formula S2A and S2B, k is an integer of 1 to 5.

dissolved in 80 mL of toluene, and were heated at a temperature of 112° C., refluxed for 2 hours, and then cooled for reprecipitation, followed by filtering with 2% HCl solution and drying to obtain 3,5-diallyl isocyanurate propylamine. 0.17 mole of 3,5-diallyl isocyanurate propylamine was added to 400 mL (0.2 mole) of an aqueous sodium hydroxide solution, reacted at a temperature of 70° C. for 1 hour and then cooled to room temperature, vacuum dried to remove moisture, and purified to obtain 3,5-diallyl isocyanurate propylamine sodium salt. The 3,5-diallyl isocyanurate proformula S2A

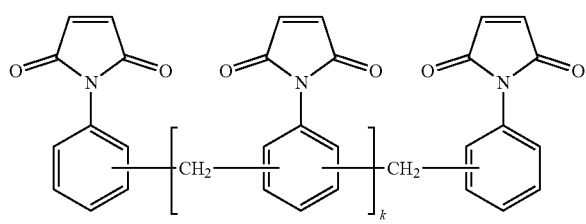

formula S2B

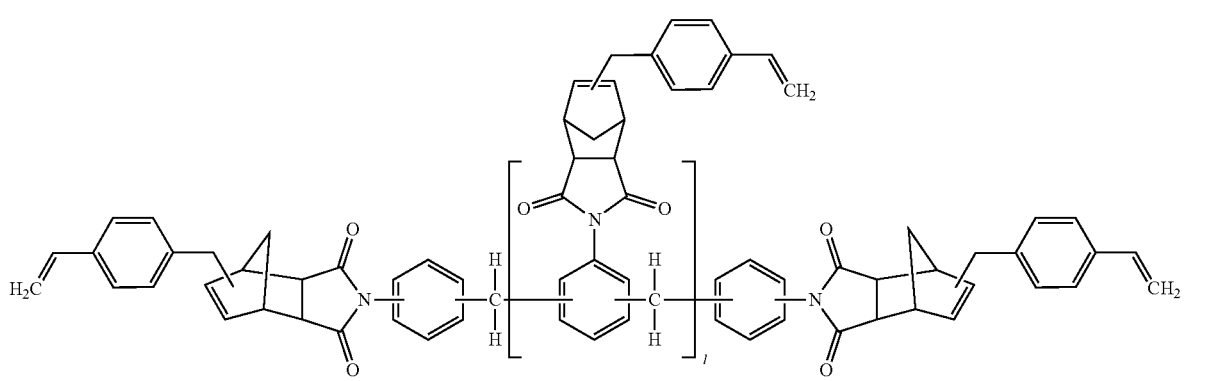

4.2.2. Preparation of Compound with a Structure of Formula (IV)

Synthesis Example 3: Synthesis of Di-L-DAIC 0.2 mole of 2,4,6-triallyl-1,3,5-triazine, 1.49 g of copper chloride dehydrate, and 0.2 mole of allyl alcohol were pylamine sodium salt and 1,4-dichlorobutane in a molar ratio of 2:1 were dissolved in dimethylformamide, reacted at a temperature of 54° C. for 4 hours, cooled to room temperature, filtered to remove inorganic substances, dried and purified to obtain 1,1'-(1,4-butyl)bis(3,5-diallyl-1,3,5-triazine-2,4,6-trione) (hereinafter "Di-L-DAIC"). The structure of the obtained compound is shown below:

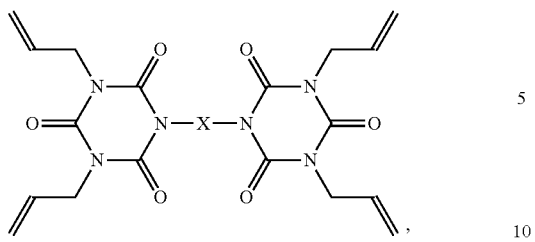

X is a C4 alkylene.

4.3. Preparation of Resin Composition

4.3.1. List of Raw Materials Used in Examples and Comparative Examples

| Raw material | Description |
| --- | --- |
| ODV-XET-3 | Polyfunctional vinyl aromatic copolymer, available from Nippon Steel Chemical & Material Company. |
| ODV-XET-4 | Polyfunctional vinyl aromatic copolymer, available from Nippon Steel Chemical & Material Company. |
| S1B | Compound having a structure of formula (I), prepared in Synthesis Example 1. |
| S2B | Compound having a structure of formula (I), prepared in Synthesis Example 2. |
| SA9000 | Polyphenylene ether resin represented by formula (II), available from SABIC Company. |
| OPE-2st | Polyphenylene ether resin represented by formula (II), available from Mitsubishi gas chemical Company. |
| IP-AMS | Diene compound with a structure of formula (III), 1,3-diisopropenyl benzene, available from Deltech Corporation. |
| Di-L-DAIC | Compound with a structure of formula (IV), prepared in Synthesis Example 3. |
| TAIC | Triallyl isocyanurate, available from Evonik Company. |
| DVB | Divinylbenzene, available from Nippon Steel Chemical & Material Company. |
| Ricon 257 | Elastomer, Styrene-butadiene-divinylbenzene copolymer, available from Cray Valley Company |
| Ricon 100 | Elastomer, Styrene-butadiene copolymer, available from Cray Valley Company. |
| Perbutyl P | Catalyst, available from NOF Corporation. |
| SC-5500 SVC | $SiO_2$ filler, available from Adamatechs Company. |

4.3.2. Preparation Method

According to the components and proportions shown in Table 1 and Table 2, the components were mixed using a stirrer at room temperature, methyl ethyl ketone (available from Methyl Company) and toluene (available from Trans Chief Chemical Industry Company) were added. Then the resultant mixture was stirred at room temperature for 60 to 120 minutes to obtain the resin compositions of Examples E1 to E13 and Comparative Examples CE1 to CE9.

TABLE 1

| Unit: parts by weight | | E1 | E2 | E3 | E4 | E5 | E6 | E7 | E8 | E9 | E10 | E11 | E12 | E13 |
| --- | --- | --- | --- | --- | --- | --- | --- | --- | --- | --- | --- | --- | --- | --- |
| Polyfunctional vinyl aromatic copolymer | ODV-XET-3 | | | | | 100 | | | | | | 100 | | 100 |
| | ODV-XET-4 | 100 | 100 | 100 | 100 | | 100 | 100 | 100 | 50 | 60 | | 100 | |
| Compound having a structure of formula (I) | S1B | 50 | | 20 | 30 | | 50 | 50 | 40 | 100 | 90 | | 50 | |
| | S2B | | 50 | | | 50 | | | | | | 30 | | 50 |
| Polyphenylene ether resin represented by formula (II) | SA9000 | | | 50 | | | | | 10 | | | | | |
| | OPE-2st | | | | 39 | | | | | | | | | |
| Diene compound with a structure of formula (III) | IP-AMS | 20 | 20 | | | 10 | | 10 | 10 | | | 10 | 20 | |
| Compound with a structure of formula (IV) | Di-L-DAIC | | | | | | 10 | 20 | 10 | 10 | | 10 | 30 | |
| Other unsaturated component | TAIC | | | | | | | | | | | | | |
| | DVB | | | | | | | | | | | | | |

TABLE 1-continued

| Unit: parts by weight | | E1 | E2 | E3 | E4 | E5 | E6 | E7 | E8 | E9 | E10 | E11 | E12 | E13 |
|---|---|---|---|---|---|---|---|---|---|---|---|---|---|---|
| Elastomer | Ricon 257 | 19 | 19 | | 19 | | 19 | 19 | 19 | 19 | 19 | | 19 | 19 |
| | Ricon 100 | | | 10 | | 10 | | | | | | 10 | | |
| Catalyst | Perbutyl P | 1 | 1 | 1 | 1 | 1 | 1 | 1 | 1 | 1 | 1 | 1 | 1 | 1 |
| Filler | SC-5500 SVC | 100 | 100 | 100 | 100 | 100 | 100 | 100 | 100 | 100 | 100 | 100 | 100 | 100 |

TABLE 2

| Unit: parts by weight | | CE1 | CE2 | CE3 | CE4 | CE5 | CE6 | CE7 | CE8 | CE9 |
|---|---|---|---|---|---|---|---|---|---|---|
| Polyfunctional vinyl aromatic copolymer | ODV-XET-3 | | | | | | | | | |
| | ODV-XET-4 | 100 | 100 | 100 | 130 | 200 | 100 | 50 | | |
| Compound having a structure of formula (I) | S1B | | | | | | | | 100 | 150 |
| | S2B | | | | | | | | | |
| Polyphenylene ether resin represented by formula (II) | SA9000 | 50 | 50 | | | | 50 | | 50 | |
| | OPE-2st | | | | 39 | | | | | |
| Diene compound with a structure of formula (III) | IP-AMS | | | | | | | | | |
| Compound with a structure of formula (IV) | Di-L-DAIC | | | | | | | | | |
| Other unsaturated component | TAIC | 20 | | | | | | 100 | | |
| | DVB | | 20 | 50 | | | | | | |
| Elastomer | Ricon 257 | 19 | | | 19 | 19 | 19 | 19 | 19 | 19 |
| | Ricon 100 | | 10 | 10 | | | | | | |
| Catalyst | Perbutyl P | 1 | 1 | 1 | 1 | 1 | 1 | 1 | 1 | 1 |
| Filler | SC-5500 SVC | 100 | 100 | 100 | 100 | 100 | 100 | 100 | 100 | 100 |

4.4. Preparation and Property Measurements of Metal-Clad Laminate

Metal-clad laminates of Examples E1 to E13 and Comparative Examples CE1 to CE9 were prepared respectively by using the resin compositions prepared. First, glass fiber cloths (Model No.: 1078; thickness: 0.043 mm) were impregnated in the resin compositions of Examples E1 to E13, and Comparative Examples CE1 to CE9 through roll coaters, and the thicknesses of the glass fiber cloths were controlled to a proper extent. The impregnated glass fiber cloths were then placed in an oven, heated, and dried at 175° C. for 2 minutes to 5 minutes to produce semi-cured (B-stage) prepregs (resin content: 70%). Afterward, several prepregs were superimposed, and two sheets of copper foils (each 0.5 oz.) were superimposed on the respective two surfaces of the outermost layers, and then the prepared objects were placed in a hot press machine to be cured through a high temperature hot-pressing. The hot-pressing conditions were as follows: heating to 200° C. to 220° C. at a heating rate of 2° C./min to 4° C./min, and hot-pressing at 200° C. to 220° C. for 120 minutes under a full pressure of 18 kg/cm$^2$ (the initial pressure was 8 kg/cm$^2$).

The properties of the metal-clad laminates of Examples E1 to E13 and Comparative Examples CE1 to CE9, including glass transition temperature (Tg), coefficient of thermal expansion (z-CTE), dielectric properties, aging resistance, PCT heat resistance, processing stability (including filling and tackiness properties), peeling strength, and water absorption rate, were tested according to the aforementioned testing methods, and the results are tabulated in Table 3 and Table 4.

TABLE 3

| | E1 | E2 | E3 | E4 | E5 | E6 | E7 | E8 |
|---|---|---|---|---|---|---|---|---|
| Tg (° C.) | 253 | 256 | 250 | 254 | 259 | 253 | 259 | 257 |
| z-CTE (%) | 2.3 | 2.2 | 2.5 | 2.4 | 2.1 | 2.3 | 2.0 | 2.2 |
| $Dk_0$ | 3.0 | 3.1 | 3.1 | 3.0 | 3.1 | 3.0 | 3.0 | 3.1 |
| $Df_0$ | 0.0013 | 0.0014 | 0.0015 | 0.0015 | 0.0014 | 0.0011 | 0.0014 | 0.0014 |
| Thermal-oxidative aging resistance ($\Delta Df_1$) | ⊚ | ⊚ | ○ | ○ | ⊚ | ⊚ | ⊚ | ⊚ |
| Damp-heat aging resistance ($\Delta Df_2$) | ⊚ | ⊚ | ○ | ○ | ⊚ | ⊚ | ⊚ | ⊚ |
| PCT heat resistance | ○ | ○ | ○ | ○ | ○ | ○ | ○ | ○ |
| Filling test | ○ | ○ | ○ | ○ | ○ | ○ | ○ | ○ |
| Tackiness test | ○ | ○ | ○ | ○ | ○ | ○ | ○ | ○ |
| Peeling strength (lbf/in) | 4.6 | 4.6 | 4.2 | 4.3 | 4.6 | 4.8 | 4.6 | 4.3 |
| Water absorption rate | 0.11 | 0.11 | 0.15 | 0.15 | 0.10 | 0.10 | 0.10 | 0.14 |

| | E9 | E10 | E11 | E12 | E13 |
|---|---|---|---|---|---|
| Tg (° C.) | 275 | 267 | 257 | 260 | 265 |
| z-CTE (%) | 1.3 | 1.5 | 2.0 | 1.9 | 1.8 |
| $Dk_0$ | 3.1 | 3.1 | 3.0 | 3.0 | 3.0 |

TABLE 3-continued

| | | | | | |
|---|---|---|---|---|---|
| Df₀ | 0.0015 | 0.0015 | 0.0014 | 0.0011 | 0.0013 |
| Thermal-oxidative aging resistance (ΔDf₁) | ◎ | ◎ | ◎ | ◎ | ◎ |
| Damp-heat aging resistance (ΔDf₂) | ◎ | ◎ | ◎ | ◎ | ◎ |
| PCT heat resistance | ○ | ○ | ○ | ○ | ○ |
| Filling test | ○ | ○ | ○ | ○ | ○ |
| Tackiness test | ○ | ○ | ○ | ○ | ○ |
| Peeling strength (lbf/in) | 4.6 | 4.7 | 4.9 | 4.3 | 4.4 |
| Water absorption rate | 0.13 | 0.12 | 0.11 | 0.12 | 0.12 |

TABLE 4

| | CE1 | CE2 | CE3 | CE4 | CE5 | CE6 | CE7 | CE8 | CE9 |
|---|---|---|---|---|---|---|---|---|---|
| Tg (° C.) | 210 | 221 | 199 | 178 | 159 | 179 | 131 | 231 | 240 |
| z-CTE (%) | 3.1 | 2.9 | 3.0 | 3.3 | 3.5 | 3.4 | 5.2 | 2.8 | 2.7 |
| Dk₀ | 3.1 | 3.1 | 3.0 | 3.0 | 2.9 | 3.0 | 3.4 | 3.1 | 3.1 |
| Df₀ | 0.0017 | 0.0016 | 0.0015 | 0.0014 | 0.0012 | 0.0015 | 0.0023 | 0.0018 | 0.0017 |
| Thermal-oxidative aging resistance (ΔDf₁) | X | X | Δ | X | Δ | X | X | Δ | Δ |
| Damp-heat aging resistance (ΔDf₂) | X | X | Δ | X | Δ | X | X | Δ | Δ |
| PCT heat resistance | ○ | ○ | ○ | X | X | X | ○ | ○ | ○ |
| Filling test | ○ | X | X | ○ | ○ | ○ | ○ | ○ | ○ |
| Tackiness test | ○ | ○ | ○ | X | X | X | X | ○ | ○ |
| Peeling strength (lbf/in) | 3.0 | 2.9 | 2.8 | 2.3 | 2.2 | 2.4 | 3.3 | 3.9 | 4.2 |
| Water absorption rate | 0.27 | 0.25 | 0.22 | 0.23 | 0.20 | 0.25 | 0.36 | 0.23 | 0.21 |

As shown in Table 3 and Table 4, the metal-clad laminates prepared from the resin compositions of the present invention has outstanding glass transition temperature (Tg), coefficient of thermal expansion (z-CTE), dielectric properties, aging resistance, PCT heat resistance, processing stability (filling and tackiness properties), peeling strength, and water absorption rate. By contrast, the Comparative Examples show that if the resin composition does not comprise both the polyfunctional vinyl aromatic copolymer (A) and the compound (B) having a structure of formula (I), the obtained metal-clad laminate cannot simultaneously have the aforementioned outstanding properties.

In particular, the comparison between Example E12 and Comparative Examples CE5 and CE9 shows that if the resin composition comprises only the polyfunctional vinyl aromatic copolymer (A) (Comparative Example CE5), the obtained metal-clad laminate has a low glass transition temperature (Tg), a high coefficient of thermal expansion (z-CTE), poor aging resistance, poor heat resistance after moisture absorption, poor tackiness, poor peeling strength and poor water absorption rate. If the resin composition comprises only the compound (B) having a structure of formula (I) (Comparative Example CE9), the obtained metal-clad laminate has a high coefficient of thermal expansion (z-CTE), poor aging resistance, and poor water absorption rate.

Furthermore, the comparison between Examples E3 and E4 and Comparative Examples CE4 and CE6 shows that when the resin composition comprises polyphenylene ether resin (C) (Comparative Examples CE4 and CE6), the obtained metal-clad laminate has extremely poor aging resistance. However, by the combination use of the polyfunctional vinyl aromatic copolymer (A) and the compound (B) having a structure of formula (I) (Examples E3 and E4), the aging resistance can be significantly improved.

The above examples illustrate the principle and efficacy of the present invention and show the inventive features thereof. People skilled in this field may proceed with a variety of modifications and replacements based on the disclosures and suggestions of the invention as described without departing from the principle thereof. Therefore, the scope of protection of the present invention is as defined in the claims as appended.

What is claimed is:

1. A resin composition, which comprises:
   (A) a polyfunctional vinyl aromatic copolymer; and
   (B) a compound having a structure of formula (I),

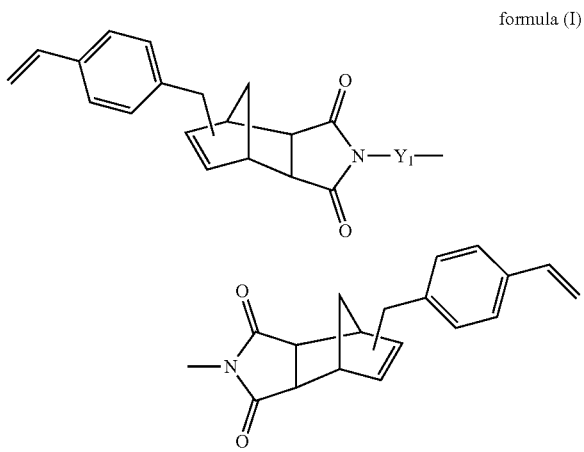

formula (I)

wherein the polyfunctional vinyl aromatic copolymer (A) is prepared by copolymerizing one or more divinyl aromatic compounds with one or more monovinyl aromatic compounds, and in formula (I), $Y_1$ is an organic group, and wherein the weight ratio of the polyfunctional vinyl aromatic copolymer (A) to the compound (B) having a structure of formula (I) is 5:1 to 1.4:1.

2. The resin composition of claim 1, wherein the polyfunctional vinyl aromatic copolymer (A) comprises a structural unit selected from the group consisting of

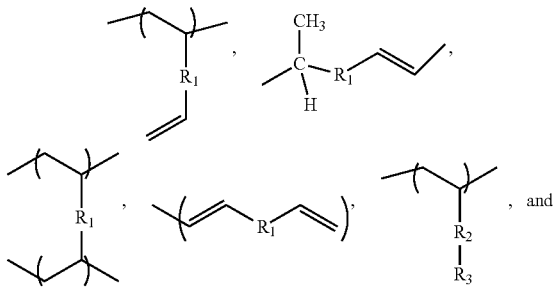

, and

-continued wherein $R_1$ and $R_2$ are independently a C6-C12 aromatic hydrocarbyl, and $R_3$ is H or a C1-C12 hydrocarbyl.

3. The resin composition of claim 1, wherein the divinyl aromatic compound is selected from the group consisting of divinylbenzene, divinylnaphthalene, divinylbiphenyl, and isomers of the preceding compounds.

4. The resin composition of claim 1, wherein the monovinyl aromatic compound is selected from the group consisting of nuclear-alkyl-substituted vinyl aromatic compound, α-alkyl-substituted vinyl aromatic compound, β-alkyl-substituted vinyl aromatic compound, and alkoxyl-substituted vinyl aromatic compound, and combinations thereof.

5. The resin composition of claim 1, wherein $Y_1$ in formula (I) is

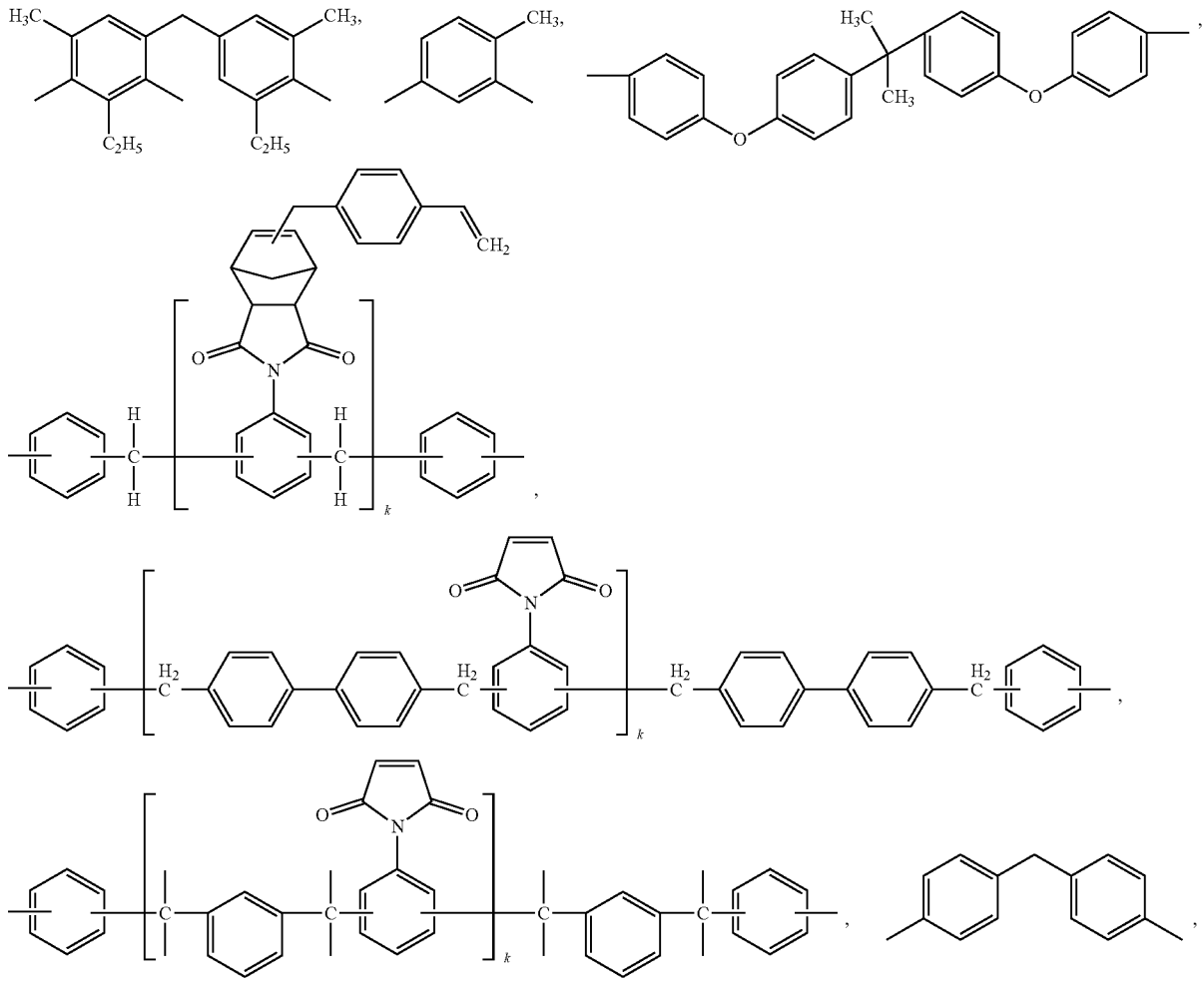

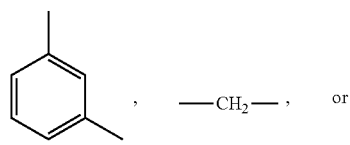, —CH$_2$—, or 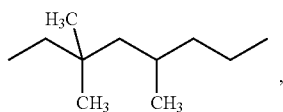, wherein k is an integer of 1 to 5.

6. The resin composition of claim 1, further comprising:
(C) a polyphenylene ether resin represented by the following formula (II):

formula (II)

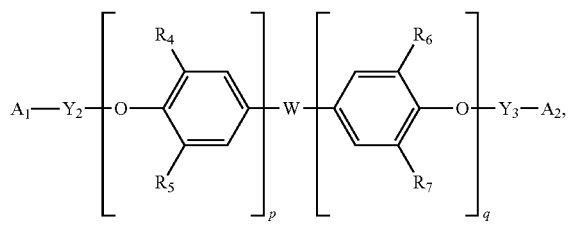

in formula (II),

R$_4$, R$_5$, R$_6$ and R$_7$ are independently H, or a substituted or unsubstituted C1-C5 alkyl;

p and q are independently an integer from 0 to 100, with the proviso that p and q are not both 0;

Y$_2$ and Y$_3$ are independently a direct bond, a carbonyl group, or an alkenyl-containing group;

A$_1$ and A$_2$ are independently

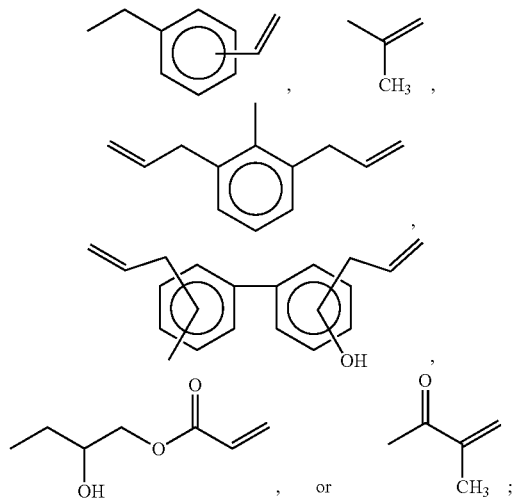

and

W is a direct bond, —O—,

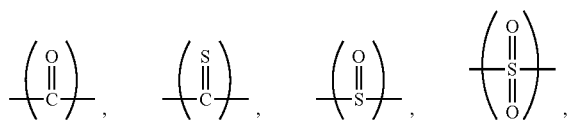

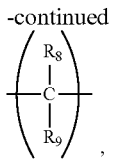, or aryl, wherein R$_8$ and R$_9$ are independently H or a C1-C12 alkyl.

7. The resin composition of claim 1, further comprising:
(D) a diene compound with a structure of formula (III):

formula (III)

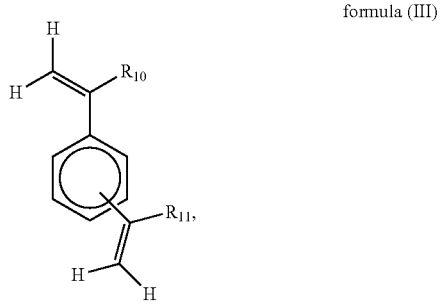

in formula (III), R$_{10}$ and R$_{11}$ are independently H, a C1-C6 linear or branched alkyl, with the proviso that R$_{10}$ and R$_{11}$ are not both H.

8. The resin composition of claim 1, further comprising:
(E) a compound with a structure of formula (IV):

formula (IV)

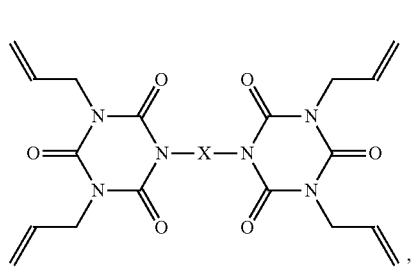

in formula (IV), X is a C1-C10 linear or branched alkylene.

9. The resin composition of claim 1, further comprising an additive selected from the group consisting of catalysts, elastomers, fillers, dispersing agents, tougheners, viscosity modifiers, flame retardants, plasticizers, coupling agents, and combinations thereof.

10. The resin composition of claim 9, further comprising a catalyst selected from the group consisting of dicumyl peroxide, tert-butyl peroxybenzoate, di-tert-amyl peroxide (DTAP), isopropylcumyl-tert-butyl peroxide, tert-butylcumylperoxide, di(isopropylcumyl) peroxide, di-tert-butyl peroxide, α,α'-bis(tert-butylperoxy)diisopropyl benzene, benzoyl peroxide (BPO), 1,1-bis(tert-butylperoxy)-3,3,5-trimethylcyclohexane, 4,4-di(tert-butylperoxy)butyl valerate, 2,5-dimethyl-2,5-di(tert-butylperoxy) hexane, 2,5-dimethyl-2,5-di(tert-butylperoxy)-3-hexyne, and combinations thereof.

11. The resin composition of claim 9, further comprising an elastomer selected from the group consisting of polybutadiene, styrene-butadiene copolymer, styrene-butadiene-divinylbenzene copolymer, polyisoprene, styrene-isoprene copolymer, acrylonitrile-butadiene copolymer, acrylonitrile-butadiene-styrene copolymer, functional modified derivatives of the preceding compounds, and combinations thereof.

12. The resin composition of claim 9, further comprising a filler selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene powders, glass beads, ceramic whiskers, carbon nanotubes, nanosized inorganic powders, and combinations thereof.

13. A prepreg, which is prepared by impregnating a substrate with the resin composition of claim 1 or by coating the resin composition of claim 1 onto a substrate and drying the impregnated or coated substrate.

14. A metal-clad laminate, which is prepared by laminating the prepreg of claim 13 and a metal foil.

15. A printed circuit board, which is prepared from the metal-clad laminate of claim 14.

16. A metal-clad laminate, which is prepared by coating the resin composition of claim 1 onto a metal foil and drying the coated metal foil.

17. A printed circuit board, which is prepared from the metal-clad laminate of claim 16.

18. A resin composition, which comprises:
(A) a polyfunctional vinyl aromatic copolymer; and
(B) a compound having a structure of formula (I),

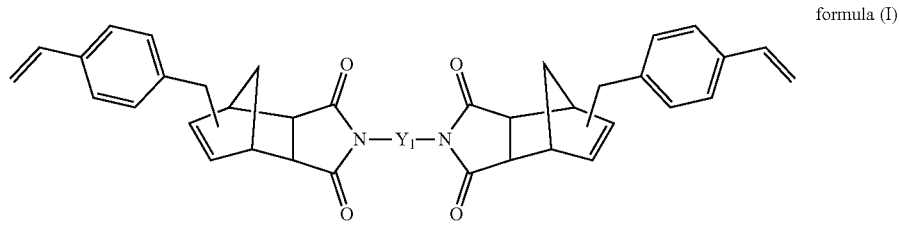

formula (I)

wherein the polyfunctional vinyl aromatic copolymer (A) is prepared by copolymerizing one or more divinyl aromatic compounds with one or more monovinyl aromatic compounds, and in formula (I), $Y_1$ is an organic group; and
(E) a compound with a structure of formula (IV):

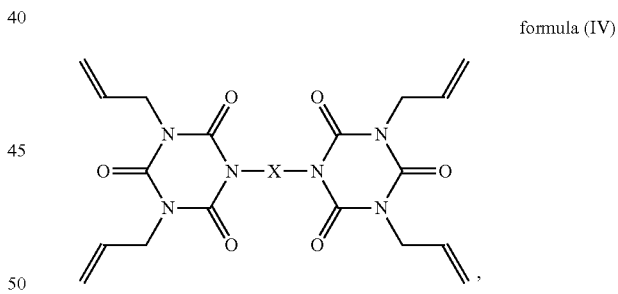

formula (IV)

in formula (IV), X is a C1-C10 linear or branched alkylene.

* * * * *